United States Patent
Gledhill et al.

(10) Patent No.: US 10,923,318 B2
(45) Date of Patent: Feb. 16, 2021

(54) OPTICAL ALIGNMENT CORRECTION USING CONVOLUTIONAL NEURAL NETWORK EVALUATION OF A BEAM IMAGE

(71) Applicant: FEI Company, Hillsboro, OR (US)

(72) Inventors: Galen Gledhill, Portland, OR (US); Mostafa Maazouz, Hillsboro, OR (US); Gavin Mitchson, Portland, OR (US)

(73) Assignee: FEI Company, Hillsboro, OR (US)

( * ) Notice: Subject to any disclaimer, the term of this patent is extended or adjusted under 35 U.S.C. 154(b) by 244 days.

(21) Appl. No.: 16/228,201

(22) Filed: Dec. 20, 2018

(65) Prior Publication Data

US 2020/0203122 A1    Jun. 25, 2020

(51) Int. Cl.
| | | |
|---|---|---|
| *H01J 37/304* | (2006.01) | |
| *H01J 37/305* | (2006.01) | |
| *G01T 1/29* | (2006.01) | |
| *G06N 3/08* | (2006.01) | |
| *G06N 3/04* | (2006.01) | |

(52) U.S. Cl.
CPC .......... *H01J 37/304* (2013.01); *G01T 1/2914* (2013.01); *G06N 3/04* (2013.01); *G06N 3/084* (2013.01); *H01J 37/3053* (2013.01); *H01J 2237/30427* (2013.01); *H01J 2237/30433* (2013.01)

(58) Field of Classification Search
CPC .................. H01J 37/304; H01J 37/3053; H01J 2237/30427; H01J 2237/30433; G06N 3/084; G06N 3/04; G06N 3/0481; G06N 3/0454; G01T 1/2914; G01N 23/2251; G01N 23/2255; G01N 2223/303; G01N 2223/401; G01N 2223/5055

See application file for complete search history.

(56) References Cited

U.S. PATENT DOCUMENTS

| | | | |
|---|---|---|---|
| 6,272,392 B1 * | 8/2001 | Capodieci | G03F 7/705 700/110 |
| 2017/0047195 A1 * | 2/2017 | Lee | H01L 22/20 |
| 2017/0351952 A1 * | 12/2017 | Zhang | G06N 3/0454 |
| 2020/0018944 A1 * | 1/2020 | Fang | G06T 7/0002 |
| 2020/0312611 A1 * | 10/2020 | Potocek | H01J 37/222 |

* cited by examiner

*Primary Examiner* — Michael C Bryant
(74) *Attorney, Agent, or Firm* — Klarquist Sparkman, LLP

(57) ABSTRACT

A focused ion beam (FIB) is used to mill beam spots into a substrate at a variety of ion beam column settings to form a set of training images that are used to train a convolutional neural network. After the neural network is trained, an ion beam can be adjusted by obtaining spot image which is processed with the neural network. The neural network can provide a magnitude and direction of defocus, aperture position, lens adjustments, or other ion beam or ion beam column settings. In some cases, adjustments are not made by the neural network, but serve to indicate that the ion beam and associated ion column continue to operate stably, and additional adjustment is not required.

28 Claims, 5 Drawing Sheets

OPTICAL ALIGNMENT CORRECTION USING CONVOLUTIONAL NEURAL NETWORK EVALUATION OF A BEAM IMAGE

FIELD

The disclosure pertains to ion beam alignment methods and apparatus.

BACKGROUND

Ion beams have numerous applications in processing of semiconductor and other substrates. However, many applications require precise control of ion beam placement and of ion beam temporal and spatial characteristics. Imaging-based beam alignment methods used in Scanning Electron Microscopy (SEM) and low current focused ion beam (FIB) applications have not been successfully transferred to high current FIB milling such as plasma FIB (PFIB) milling. In conventional approaches, PFIB beams are manually aligned, but such manual alignment tends to be time consuming and can fail to provide proper adjustment of an ion beam column so that even after alignment, an ion beam remains either unsuitable for a particular application, or exhibits undesirable characteristics that degrade FIB processing. Improved approaches are needed.

SUMMARY

Methods comprise exposing a substrate to an ion beam to obtain a plurality of training spot images, each of the training spot images associated with at least one ion beam column characteristic. A convolutional neural network is defined based on the individual training spot images so that the neural network is configured to indicate the at least one ion beam column characteristic. In some examples, the training spot images are images of beam spots milled into a substrate with the ions. In a particular example, the milled beam spots are arranged in an array, and the array is segmented to produce the training spot images. In further examples, an operational exposure spot image is obtained and processed with the neural network. Based on the processing, the the ion beam column is adjusted. In typical examples, an initial layer of the neural network is a convolutional layer, and the training spot images are coupled to the convolutional layer. According to some examples, the at least one ion beam column characteristic is at least one of a lens focus, an ion beam current, a location of a beam defining aperture, or a stigmator. In some alternatives, the neural network includes an initial convolution layer, and one or more additional convolutional layers and a pooling layer. According to other alternatives, the training spot images are arranged in an image stack that is presented for training the neural network. In some examples, the training spot images are H1 pixels wide by H2 high, and the initial convolutional layer of the neural network includes N convolution kernels that map the training spot images to a J by J by N data stack, wherein H, J, and N are positive integers, and J is less than H. In still further examples, the individual training spot images are processed to define the plurality of convolution kernels. In still further examples, the at least one ion beam column characteristic includes an ion beam shape or an ion beam spot size. According to some examples, at least one ion beam column parameter is varied so that the training spot images are associated with the at least one ion beam column characteristic associated with the at least one ion beam column parameter.

Systems comprise a charged particle beam source and a charged particle beam column. A processor is coupled to the charged particle beam column and configured to process a spot image obtained with the charged particle beam source and the charged particle beam column with a neural network to determine at least one adjustment of the charged particle beam source and the charged particle beam column. In some examples, a computer readable storage device has stored thereon computer-executable instructions defining the neural network. In additional examples, the processor is further configured to adjust at least one of the charged particle beam source and the charged particle beam column based on the determined adjustment. In further examples, processor is configured to receive a plurality of training spot images associated with the charged particle beam and the charged particle beam column, and define the neural network based on the training spot images.

In typical examples, the plurality of training spot images is obtained based on exposure of a substrate to the charged particle beam. In further examples, the processor is coupled to adjust at least the charged particle beam column to produce the plurality of training spot images. In other examples, the processor is configured to produce the plurality of training spot images as images of an array of milled beam spots, wherein each milled beam spot of the array of milled beam spots is associated with corresponding charged particle beam column settings. In other representative embodiments, the processor is configured to segment an image of the array milled beam spots and provide the training spot images to the neural network as a stack of individual training spot images.

Additional methods comprise obtaining a plurality of images of a beam produced at a test substrate at corresponding focus settings. A convolutional neural network is trained with the plurality of images. An operational image of the focused beam is obtained, and the operational image is processed to determine a focus adjustment. In some examples, a beam focus is adjusted based on the determined adjustment. In particular embodiments, the beam is a charged particle beam or an optical beam.

The foregoing and other features, and advantages of the disclosed technology will become more apparent from the following detailed description, which proceeds with reference to the accompanying figures.

DETAILED DESCRIPTION

Figure 1:
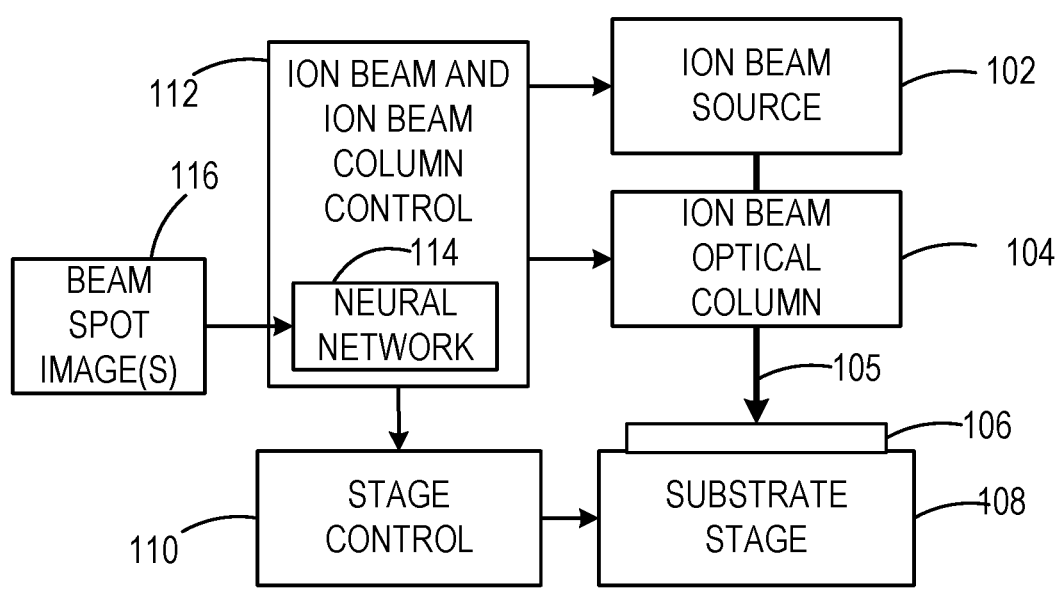
FIG. 1 illustrates a representative focused ion beam (FIB) system that includes a neural network based controller for confirming performance of or adjusting an ion beam or an ion beam column.

Disclosed herein are methods and apparatus that permit automated alignment and validation of beams such as focused ion beams, including high current ion beams, or other charged particle beams (CPBs) or optical beams. For convenience, some examples are described with reference to focused ion beams (FIBs). FIBs and other CPBs are generally directed to a target or other substrate using a CPB column. As used herein a CPB column can include lenses (for example, magnetic or electrostatic lenses), beam deflectors, beam apertures, stigmators, or other components controllable to shape and direct a CPB. In the examples, images of substrate exposures to a CPB using a CPB column are obtained for use in training a neural network. As used herein, image refers to a visual image of a target exposure or a stored or storable numerical representation of an actual or simulated target exposure. In some examples, CPBs such as FIBs are used to impress spot patterns on a substrate by, for example, FIB milling, and images of these spot patterns are used as training spot patterns to define a neural network that can then be used to identify spot characteristics and permit CPB column adjustments to correct or compensate any mis-adjustment or otherwise modify CPB column and CPB source characteristics. Adjustments can pertain to currents, voltages, or other electrical signals applied to energize CPB lenses or correct or compensate lens aberrations or misalignments. In other examples, positions of components can be adjusted such as locations of apertures. In still further examples, beam and column performance is assessed without adjustment to confirm beam spot properties such as spot shape. In other examples, optical beams and associated optical beam focusing and control components can be similarly evaluated to determine appropriate adjustments. In typical examples, spot images are two dimensional images, but one, two, or three dimensional images can be used as preferred.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Some examples refer to computer readable storage media and/or storage devices. As used herein, such media and storage devices refer to non-transitory storage media and devices, respectively.

The examples disclosed below can permit beam adjustment and alignment of various beam types, including ion beams used for milling. For milling beams, beam alignment and adjustment prior to substrate milling is typically required as processing with such an ion beam is irreversible; and poor beam quality can result in a substrate that must be discarded. It can be advantageous if beam alignment and adjustment can be automated to expedite processing, and if such alignment and adjustment can be performed on bare substrates or other substrates without significant prior processing. As noted above, for high current ion beam, tails of a beam current distribution can be important, and any alignment and adjustment preferably takes into account such tails. The disclosed methods and apparatus also permit objective assessment of an ion beam system to, for example, confirm that beam parameters are stable or unchanged from target values.

While implementations using focused ion beams are discussed below for convenient illustration, other CPB systems can also be used. For example, training images can be used as a training set, and formation of spots as is typical with a focused ion beam is not required. Such training images can be formed using various CPBs. For example, CPB patterns (such as beam spots), electron beam images of a substrate, or other CPB distributions can be obtained as images using a CPB detector or detection system such a scintillator and a charged coupled device or other array detector.

Example 1

Referring to FIG. 1, representative CPB apparatus 100 includes an ion beam source 102 such as an FIB source that is coupled to an ion beam optical column 104 to direct an FIB 105 to a substrate 106 that is retained by a substrate stage 108. The substrate stage 108 is coupled to a stage controller 110 that selectively moves the substrate 106 to a preferred position for processing or ion beam or ion beam column evaluation. For example, the substrate 106 can be moved so that a plurality of beam spots such as an array of beam spots can be formed in the substrate 106 for use in evaluation, correction, or verification of the performance of the ion beam source 102 or the ion beam column 104, or to produce beam spots for use in training a neural network 114.

A CPB system controller 112 typically includes a processor, ASIC, or other processing hardware and suitable computer-executable instructions stored in a computer readable medium or device. In other examples, computer-executable instructions and/or storage for such instructions can be provided via a network such as a local area network or a wide area network. The CPB system controller 112 typically includes a computer readable memory such as RAM, ROM, a hard disk, or other storage device that includes computer-executable instructions that implement a neural network that provides characterization of one or more components to the ion beam source 102, the ion beam optical column, the substrate stage, or other portions of the CPB apparatus 100. As discussed in detail below, the neural network 114 can receive multiple spot images produced in response to ion beam irradiation as a training set to establish the neural network 105. Once established, one or more beam spot images can be processed by the neural network to permit adjustment of the CPB apparatus 100.

As discussed above, the ion beam optical column 104 can include one or more ion beam lenses, beam deflectors, beam apertures, stigmators, or other components. Adjustments of these components can be made using electrical signals such as applied voltages or currents, or mechanical movements such as translations and rotations.

Example 2

Figure 2A:
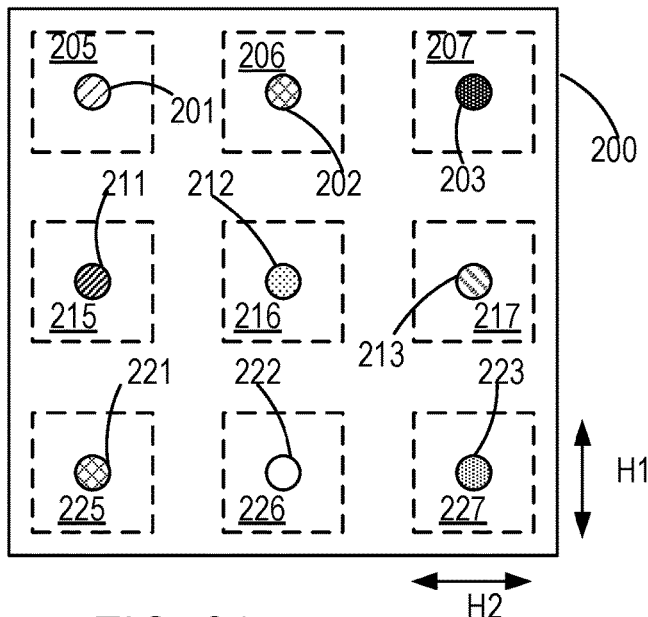
FIG. 2A illustrates a representative beam spot array that can be formed by milling a test substrate with an ion beam with a plurality of selected ion beam column settings.
Figure 2B:
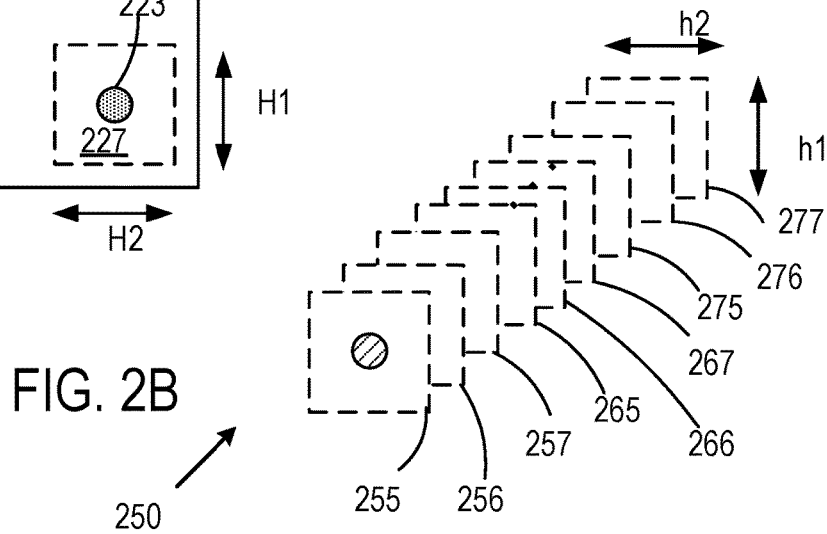
FIG. 2B illustrates beam spot images corresponding the beam spot array of FIG. 2A that can be used to form a neural network training set.

FIGS. 2A-2B illustrate beam spots formed using an ion beam such as illustrated in FIG. 1, but in other examples, beam spots can be formed with other CPBs or optical beams as appropriate. Referring to FIG. 2A, beam spot regions 205-207, 215-217, 225-227 are defined on a substrate 200. Each of the beam spot regions 205-207, 215-217, 225-227 includes a respective beam spot 201-203, 211-213, 221-223 formed in response to irradiation of the substrate 200 by the ion beam. In the example of FIG. 2A, each of the beam spot regions has dimensions H1 by H2. In some cases, it is convenient to define beam spot regions with H1=H2, but beam spot regions of arbitrary size and shape can be used. In addition, while nine beam spot regions are illustrated in FIG. 2A, few or more can be used, and typically many more are used to provide beam spots in defining a training set for a neural network.

The beam spot regions 205-207, 215-217, 225-227 can have predetermined dimensions and locations based on beam displacements applied in generating the beam spots. Because in some applications, portions of FIBs distant from a central portion can impact processing, dimensions are selected to include "tails" of the applied beams. In other examples, beam spot region dimensions can be determined from measured separations of the beam spots.

Typically images of each of the beam spot regions are obtained using an electron microscope associated with an FIB system that provides the FIB used to produce the beam spots. Images can be obtained in other way such as with an unrelated electron microscope system or other imaging system. These images can be stored in various formats, and image dimensions of 128 pixels by 128 pixels are typical, but smaller or larger images can be used. Images 255-257, 265-267, 275-277 of beam spots 205-207, 215-217, 225-227, respectively, can be stored in a computer readable medium as arranged in a stack 250 as shown in FIG. 2B. For example, each of the images 255-257, 265-267, 275-277 can include a pixel array of image intensities I having dimensions h1 and h2, wherein h1 and h2 are positive integers, i.e., of values of intensity I(i,j), wherein i, j are integers between 1 and h1 and 1 and h2, respectively. With such a representation, the image stack 250 can be represented as I(i,j,k), wherein k is an integer that denotes a specific image. In other examples, images can include multiple values as well such as color values or pseudo-color values, or other values associated with properties of beam spots. As discussed below, each of the images and associated image values I(i,j,k) is typically associated with one or more beam or test substrate settings.

Example 3

Figure 3:
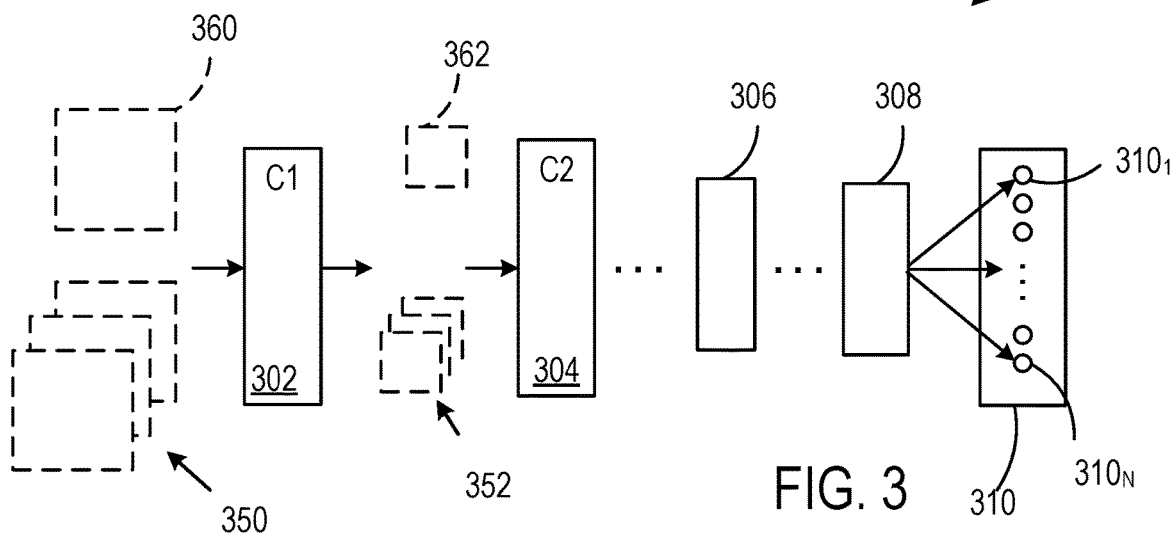
FIG. 3 illustrates a representative convolutional neural network suitable for use in control of an ion beam system.

With reference to FIG. 3, a representative neural network 300 suitable for processing beam spot images include one or more convolutional layers such as convolutional layers 302, 304 and one or more additional layers such as layers 306, 308 which can be pooling layers, normalization layers, fully connected layers, or other types of layers. As needed, layers can use various activation functions such as a sigmoid function, an arc tangent function, a hyperbolic tangent function, and various bias values. The neural network 300 provides a characterization of an input beam spot image as a set of values 310 illustrated in FIG. 3 as a column vector having elements 1 to N, but other arrangements can be used.

The neural network 300 can be trained using a stack of beam spot images. For example, a beam spot grid is generated by milling or otherwise exposing a test substrate such as a silicon substrate. The beam spot grid is then processed to form beam spot images that can be arranged in a stack, with each beam spot image associated with a respective defocus. For example, beam spots can be formed by adjusting nominal focus over a range of ±10, 20, 50, 100, 150, 200 μm or over a smaller or larger range. Focus can be adjusted by varying beam focus parameters (such a CPB lens or deflector drive voltages) or by adjusting test substrate position with respect to a nominal beam focus. Each beam spot image is thus associated with a particular beam defocus.

The convolutional layer 302 includes M convolution kernels that are applied to the beam spot images so that a stack 350 of h by h pixels images is transformed into an I by I by M data stack 352 which is then supplied to the convolutional layer 304, and then for further processing with the additional layers 306, 308. In a representative example, values in the column vector correspond to sample height with respect to focus and beam alignment along ion beam column axis. For example, an element 3101 can correspond to a magnitude and a direction of beam spot displacement from from a focus position, an element 3102 can correspond to a magnitude and a direction of beam spot displacement from an ion beam column axis, an element 3103 can correspond to a beam spot shape such as a deviation of beam cross section from circularity.

The neural network 302 can be defined using back propagation or other approach to adjust layer parameters to produce the desired neural network outputs to reduce differences between neural network output values and values associated with the training set. For example, the convolutional kernels can be determined in view of these differences. The number, type, and arrangement of layers can be selected to produce acceptable differences between neural network output values and values associated with the training set.

Although beam spots images for a training set can be obtained with varying focus conditions, each of the beam spot regions can be associated with a beam exposure under a selected set of control parameters to produce a training set. For example, one or more of a location of a beam defining aperture (BDA), a power of one or more lenses, a beam deflection magnitude, stigmator settings, substrate stage displacement, beam current, or other parameters can be varied. For FIB systems, beam spots are produced as FIB milled regions, but spot images can be obtained in other ways. In some examples, ion beam column parameters are varied in a computer-based model of the ion beam column to produce a training set of spot images without producing milled spots. Multiple parameters can be varied in the images of the training set so that the neural network can provide indications of numerous settings of the FIB and related ion beam column and specimen stage.

Once trained, the neural network 300 is provided with a beam spot image 360 so that any preferred adjustments can be made, or to confirm that instrument performance remains acceptable. As shown in FIG. 3, an operational beam spot image 360 is processed by the convolutional layer 302 to reduce the h by h pixels of beam spot image 360 to an I by I array 362 which is then further processed with the remaining neural network layers. Processing the operational beam spot image 360 produces an operational column vector that indicates performance values associated with the ion beam or ion beam column characteristics and settings provided in the training set 350.

Example 4

Figure 4:
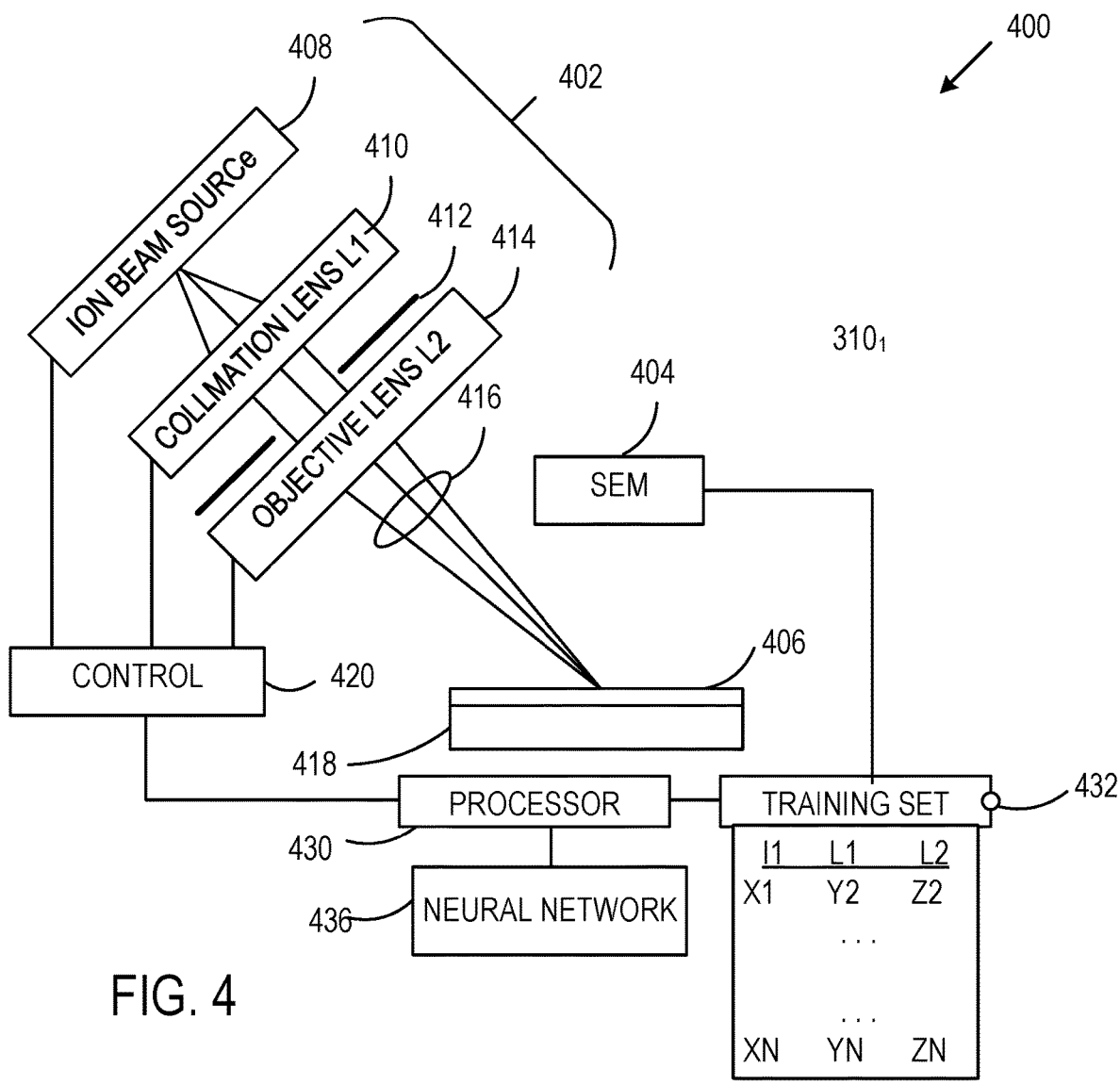
FIG. 4 illustrates a representative combined FIB/scanning electron microscope (SEM) system and acquisition of training set data for establishing neural network based instrument control and adjustment.

With reference to FIG. 4, a combined FIB/SEM system 400 includes an FIB system 402 and a SEM 404 that are situated to interact with a substrate 406. The FIB system 402 includes an ion beam source 404, a first lens 410 (L1), referred to as a collimation lens, a beam defining aperture plate 412, and a second lens 414 (L2) that produces a focused ion beam 416 for delivery to the substrate 406. A controller 420 is coupled to the ion beam source 408, the first lens 410, the aperture plate 412, and the second lens 414 as well as a substrate stage 418 to adjust electrical signals applied to the lenses 410, 414 and positions of the aperture plate 412 and the substrate 406.

A processor 430 is coupled to the controller 420 and can provide parameter ranges to be used in acquiring a training set that can be stored in a memory 432. Convolutional kernels, weights, biases and other neural network defining parameters are stored in a memory 436 along with processor-executable instructions for executing the neural network and the associated back propagation method to establish neural network parameters in response to receipt of the training set. As shown in FIG. 4, the memory 432 includes arrays of values associated with ion beam current (I1), focus of the first lens (L1), and focus of the second lens (L2) that can be used to produce milled beam spots to obtain the training set of spot images.

Example 5

Figure 5:
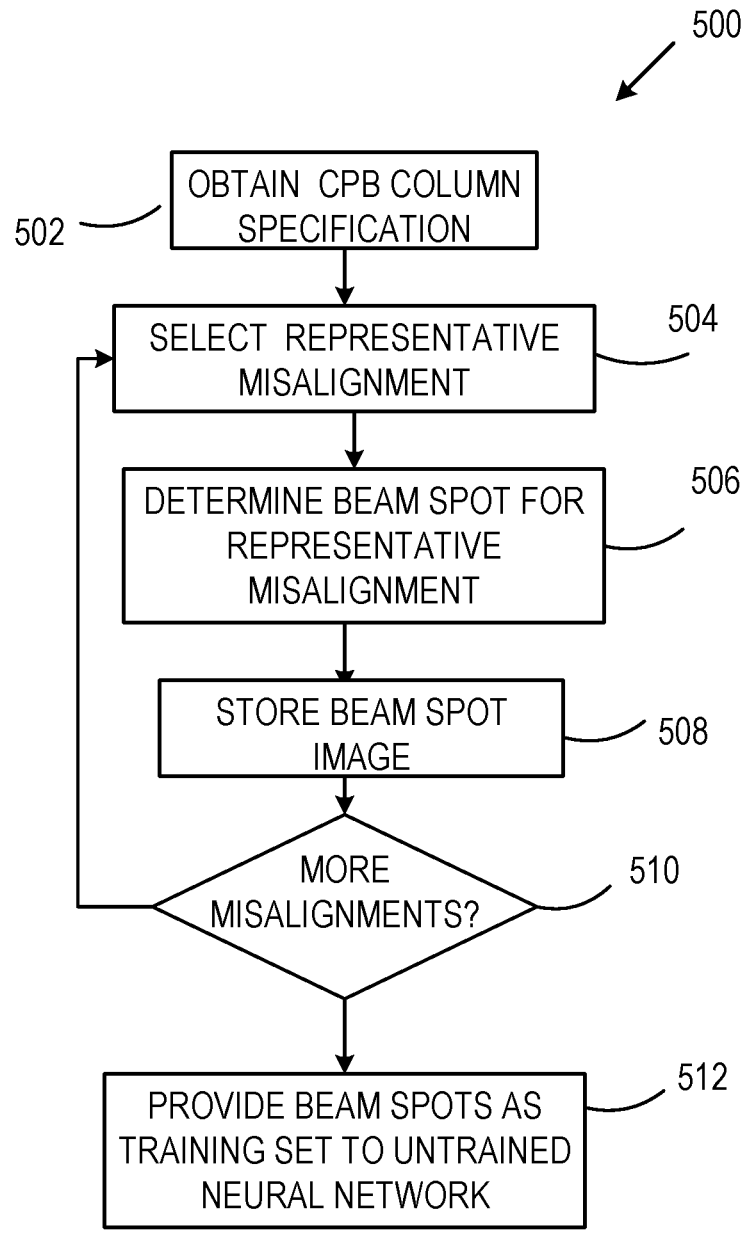
FIG. 5 illustrates a representative method of producing a training set for an FIB system.

Referring to FIG. 5, a representative method 500 includes obtaining a specification of a CPB column such as an ion beam column at 502. At 504, a value of a representative mis-alignment or other parameter of interest is selected, and at 506 a corresponding beam spot image is obtained. As discussed above, for a FIB system, milled beam spots can be used but spot images obtained with a CPB detector can also be used without milling. At 508, the associated beam spot image is stored. If additional parameters associated are to be used, processing returns to 504. Otherwise, at 512, the stored beam spots and associated parameters are provided for use as a training set. Typically, a large number of beam spot images are obtained to provide a satisfactory training set.

Example 6

Figure 6:
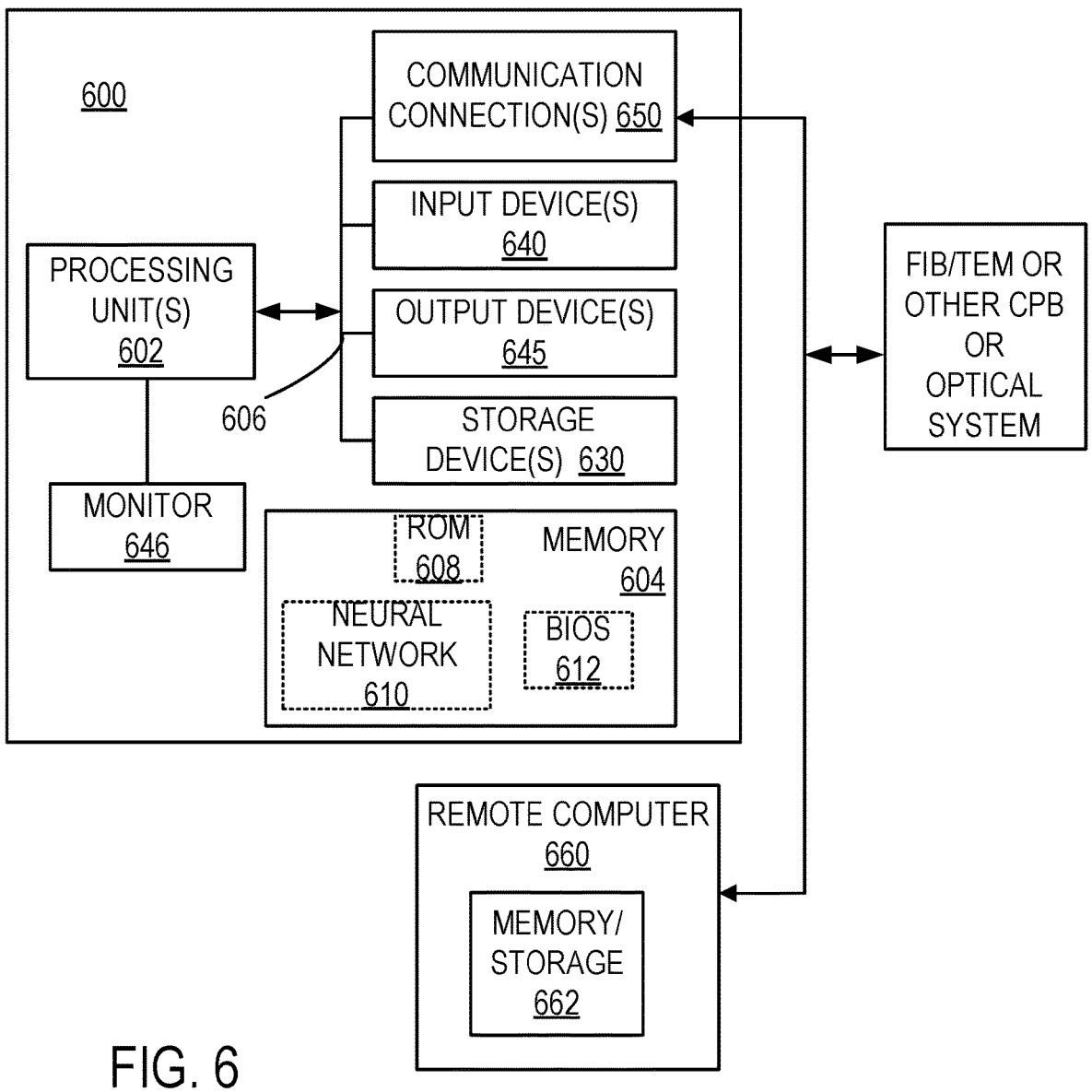
FIG. 6 illustrates a representative computing environment for implementation and training of the neural network based methods and apparatus disclosed herein.

FIG. 6 and the following discussion are intended to provide a brief, general description of an exemplary computing environment in which the disclosed neural network based methods can be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices. In other examples, dedicated processors, application specific integrated circuits (ASICS), or FPGAs can be used as well.

With reference to FIG. 6, an exemplary system for implementing the disclosed technology includes a general purpose computing device in the form of an exemplary conventional PC 600, including one or more processing units 602, a system memory 604, and a system bus 606 that couples various system components including the system memory 604 to the one or more processing units 602. The system bus 606 may be any of several types of bus structures including a memory bus or memory controller, a peripheral bus, and a local bus using any of a variety of bus architectures. The exemplary system memory 604 includes random access memory (RAM) memory 610 and read only memory (ROM) 608. Processor-executable instructions for training a neural network and neural network parameters such as weights, activation functions, and convolution kernels along with instructions for executing the neural network in response to receipt of an operational beam spot image can be stored in the RAM 610, or at some other local or remote location. A basic input/output system (BIOS) 612, containing the basic routines that help with the transfer of information between elements within the PC 600, is stored in ROM 608.

The exemplary PC 600 further includes one or more storage devices 630 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 606 by a hard disk drive interface, a magnetic disk drive interface, and an optical drive interface, respectively. The drives and their associated computer readable media provide nonvolatile storage of computer-readable instructions, data structures, program modules, and other data for the PC 600. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 630 including an operating system, one or more application programs such used to define, train, or execute a neural network, other program modules, and program data (including training set data, if needed). A user may enter commands and information into the PC 600 through one or more input devices 640 such as a keyboard and a pointing device such as a mouse. Other input devices may include a digital camera, microphone, joystick, game pad, satellite dish, scanner, or the like. These and other input devices are often connected to the one or more processing units 602 through a serial port interface that is coupled to the system bus 606, but may be connected by other interfaces such as a parallel port, game port, or universal serial bus (USB). A monitor 646 or other type of display device is also connected to the system bus 606 via an interface, such as a video adapter. Other peripheral output devices, such as speakers and printers (not shown), may be included. As used herein, storage device and memory refer to non-transitory storage devices and memory. The monitor 646 or other display devices can be used to present the results of neural network processing, indicating any necessary adjustments or confirming stable operation of an FIB or other system.

The PC 600 may operate in a networked environment using logical connections to one or more remote computers, such as a remote computer 660. In some examples, one or more network or communication connections 650 are included. The remote computer 660 may be another PC, a server, a router, a network PC, or a peer device or other common network node, and typically includes many or all of the elements described above relative to the PC 600, although only a memory storage device 662 has been illustrated in FIG. 6. The personal computer 600 and/or the remote computer 660 can be connected to a logical a local area network (LAN) and a wide area network (WAN). Such networking environments are commonplace in offices, enterprise wide computer networks, intranets, and the Internet.

When used in a LAN networking environment, the PC 600 is connected to the LAN through a network interface. When used in a WAN networking environment, the PC 600 typically includes a modem or other means for establishing communications over the WAN, such as the Internet. In a networked environment, program modules depicted relative to the personal computer 600, or portions thereof, may be stored in the remote memory storage device or other locations on the LAN or WAN. The network connections shown are exemplary, and other means of establishing a communications link between the computers may be used.

Having described and illustrated the principles of the disclosure with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples. It should be recognized that the illustrated embodiments are examples and should not be taken as a limitation on the scope of the disclosure. We therefore claim all subject matter that comes within the scope and spirit of the appended claims. Alternatives specifically addressed in the above examples are merely illustrative and do not constitute all possible alternatives to the embodiments described herein.

We claim:

1. A method, comprising: exposing a substrate to a charged particle beam (CPB) to obtain a plurality of training images, each of the training images associated with at least one CPB column characteristic; defining a neural network based on the training images so that the neural network is configured to indicate the at least one CPB column characteristic.

2. The method of claim 1, wherein the training images are obtained by detecting CPB images with a scintillator and a photodetector array.

3. The method of claim 1, wherein the CPB is an ion beam, the training images are training spot images produced by exposing the substrate to the ion beam, and further comprising:
segmenting the plurality of training spot images to form individual training spot images, wherein the neural network is based on the individual training spot images so that the neural network indicates at least one ion beam column characteristic.

4. The method of claim 3, further comprising:
obtaining an exposure spot image associated with the least one characteristic of the ion beam; and
processing the exposure spot image with the defined neural network; and
adjusting the ion beam column based on the processing.

5. The method of claim 3, wherein the neural network includes a convolution layer, and the training spot images are coupled to the convolution layer.

6. The method of claim 3, wherein the at least one ion beam column characteristic is at least one of a lens focus, an ion beam current, a location of a beam defining aperture, or a stigmator.

7. The method of claim 3, wherein the at least one ion beam column characteristic is associated with a setting of at least one beam shaping or beam deflection element.

8. The method of claim 7, wherein the at least one ion beam column characteristic is an ion beam shape or an ion beam spot size.

9. The method of claim 3, wherein the neural network includes an initial convolution layer, and one or more additional layers.

10. The method of claim 3, wherein the training spots are arranged in an array.

11. The method of claim 10, wherein the training spot images are H1 pixels wide by H2 pixels wide, and the convolution layer of the neural network includes N convolution kernels that map the training spot images to a J1 by J2 by N stack, wherein H1, H2, J1, J2, and N are positive integers, and J1 and J2 are less than H1 and H2, respectively.

12. The method of claim 11, wherein J=J1=J2 and H=H1=H2, so that the convolution kernels map the J by J training spot images to a H by H by N stack.

13. The method of claim 3, wherein the defining the neural network based on the individual training spot images comprises defining a plurality of convolution kernels.

14. The method of claim 3, further comprising forming plurality of milled beam spots with the ion beam, wherein the training spot images are images of the milled beam spots.

15. The method of claim 3, further obtaining the training spot images by imaging the focused ion beam.

16. A system, comprising:
a charged particle beam source;
a charged particle beam column; and
a processor coupled to the charged particle beam column, the processor coupled to process a spot image obtained with the charged particle beam source and the charged particle beam column with a neural network to determine at least one adjustment of the charged particle beam source and the charged particle beam column.

17. The system of claim 16, further comprising a computer readable storage device having stored thereon computer-executable instructions defining the neural network.

18. The system of claim 17, wherein the processor is further configured to adjust at least one of the charged particle beam source and the charged particle beam column based on the determined adjustment.

19. The system of claim 18, wherein the processor is further configured to adjust the charged particle beam column based on the determined adjustment.

20. The system of claim 16, wherein the processor is configured to receive a plurality of training spot images associated with the charged particle beam and the charged particle beam column, and define the neural network based on the training spot images.

21. The system of claim 20, wherein the plurality of training spot images is based on exposure of a substrate to the charged particle beam.

22. The system of claim 16, wherein the processor is coupled to adjust at least the charged particle beam column to produce the plurality of training spot images based on processing of milled beam spots on a substrate.

23. The system of claim 22, wherein the processor is configured to produce the plurality of training spot images as an array, wherein the training spot images of the array are associated with corresponding charged particle beam column settings.

24. The system of claim 23, wherein the processor is configured to segment the array of training spot images and provide the training spot images to the neural network as a stack of individual training spot images.

25. A method, comprising:
   obtaining a plurality of images of a focused beam produced at a test substrate at corresponding focus settings;
   training a convolutional neural network with the plurality of images; and
   obtaining an operational image of the focused beam; and
   processing the operational image of the focused beam to determine a focus adjustment.

26. The method of claim 25, further comprising adjusting a beam focus based on the determined adjustment.

27. The method of claim 25, wherein the beam is a charged particle beam.

28. The method of claim 25, wherein the beam is an optical beam.

* * * * *